United States Patent
Heerens et al.

(10) Patent No.: US 7,781,237 B2
(45) Date of Patent: Aug. 24, 2010

(54) ALIGNMENT MARKER AND LITHOGRAPHIC APPARATUS AND DEVICE MANUFACTURING METHOD USING THE SAME

(75) Inventors: Gert-Jan Heerens, Schoonhoven (NL); Anastasius Jacobus Anicetus Bruinsma, Delft (NL); Jacob Fredrik Frisco Klinkhamer, Delft (NL); Bastiaan Lambertus Wilhelmus Marinus Van De Ven, Rosmalen (NL); Hubert Adriaan Van Mierlo, Maassluis (NL); Willem Arthur Vliegenthart, Bunnik (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/147,114

(22) Filed: Jun. 8, 2005

(65) Prior Publication Data

US 2006/0007442 A1    Jan. 12, 2006

Related U.S. Application Data

(63) Continuation-in-part of application No. 10/863,806, filed on Jun. 9, 2004, now abandoned.

(51) Int. Cl.
*G01R 31/26* (2006.01)
*H01L 21/66* (2006.01)

(52) U.S. Cl. .............. 438/16; 438/7; 257/E21.524; 257/E21.53; 356/130; 356/622

(58) Field of Classification Search ............ 414/226.04; 257/E21.524, E21.53; 438/7, 14, 16, 795, 438/975, FOR. 435, FOR. 495; 356/130, 356/400, 622, 624

See application file for complete search history.

(56) References Cited

U.S. PATENT DOCUMENTS

| | | | | | |
|---|---|---|---|---|---|
| 5,325,414 | A | * | 6/1994 | Tanaka et al. | 378/34 |
| 5,838,450 | A | * | 11/1998 | McCoy et al. | 356/401 |
| 5,847,468 | A | * | 12/1998 | Nomura et al. | 257/797 |
| 6,417,922 | B1 | * | 7/2002 | Dirksen et al. | 356/401 |
| 2001/0006217 | A1 | * | 7/2001 | Bisschops | 250/493.1 |
| 2001/0017939 | A1 | * | 8/2001 | Yoshida | 382/151 |
| 2003/0162108 | A1 | * | 8/2003 | Burberry et al. | 430/20 |

FOREIGN PATENT DOCUMENTS

| JP | 2002-353088 A | 12/2002 |
|---|---|---|
| JP | 2003-142363 A | 5/2003 |

OTHER PUBLICATIONS

English Translation of Japanese Official Action issued on Apr. 14, 2009 in Japanese Patent Application No. 2005-168398.
Office Action issued on Jul. 22, 2008 in corresponding Japanese Application No. 2005-168398.

* cited by examiner

*Primary Examiner*—Matthew Smith
*Assistant Examiner*—Quovaunda Jefferson
(74) *Attorney, Agent, or Firm*—Pillsbury Winthrop Shaw Pittman LLP

(57) ABSTRACT

An apparatus includes a first support structure configured to support an element that has an alignment marker provided with at least one height difference. The apparatus also includes an alignment sensor comprising a light source that is configured to provide a light beam that illuminates the alignment marker; and at least one detector configured to detect the at least one height difference of the alignment marker by analyzing the light beam reflected by the alignment marker. Such an apparatus may be used to align of the element with respect to the first support structure.

25 Claims, 7 Drawing Sheets

ALIGNMENT MARKER AND LITHOGRAPHIC APPARATUS AND DEVICE MANUFACTURING METHOD USING THE SAME

RELATED APPLICATION

This application is a continuation-in-part of U.S. application Ser. No. 10/863,806, which was filed on Jun. 9, 2004, now abandoned the contents of which are incorporated herein by reference.

FIELD OF THE INVENTION

The present invention relates to lithographic apparatus and methods.

BACKGROUND

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" in such context herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The term "patterning structure" used herein should be broadly interpreted as referring to a structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning structure may be transmissive or reflective. However, beneath a certain wavelength the use of a transmissive patterning structure is no longer possible due to the lack of suitable materials that transmit illumination of that particular wavelength. In a lithographic apparatus that applies that kind of illumination, like EUV radiation, the use of a reflective patterning structure is required.

Generally, a reflective patterning structure includes a substantially flat structure provided with a reflective surface. On the surface of the structure a radiation-absorbing layer is deposited and consecutively patterned. The radiation-absorbing layer, which typically has a thickness of about 50-500 nm, absorbs the illumination. The difference between the reflection coefficients of the reflective surface and the radiation-absorbing layer enables the transfer of the pattern from the patterning structure to the target portion on a substrate.

Examples of patterning structures include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure supports, i.e. bares the weight of, the patterning structure. It holds the patterning structure in a way depending on the orientation of the patterning structure, the design of the lithographic apparatus, and other conditions, such as, for example, whether or not the patterning structure is held in a vacuum environment. The support can use mechanical clamping, vacuum, or other clamping techniques, for example, electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

In order to transfer the pattern of the patterning structure to the desired target portion on a substrate with extreme precision, the position of the patterning structure should be very well-defined. Before exposure, the patterning structure is placed on the support structure, for instance by using a robot arm. In one of several alignment steps, called pre-alignment, the position of the patterning structure with respect to the position of the support structure of the patterning structure is determined. Pre-alignment is most often carried out before the robot arm places the patterning structure on the support structure, because at that stage the position of patterning structure and support structure can be adjusted with respect to each other relatively easily.

For pre-alignment purposes, sensors are generally used to measure alignment markers at the system parts (patterning structure, substrate, support structure, stages etc.), which are aligned by illuminating them in reflection or transmission. In current optical lithography, a high contrast marker on a reflective patterning structure may be obtained by using the same techniques as used for patterning the patterning structure, i.e. by using an absorbing layer on top of a reflective substrate. However, different materials may be used to obtain the difference in reflectivity at these smaller wavelengths. As the markers are generally constructed adjacent to the pattern to be transferred, both elements may be composed of the same materials. As a result the illumination of the markers, used for pre-alignment purposes, should also include a beam having a smaller wavelength.

It is generally desirable to illuminate an alignment marker with a light source with a wavelength between 400-1500 μm. A light source for this range of wavelengths can easily be obtained and is generally inexpensive. Unfortunately, the contrast of the marker, originating from the difference in reflectivity of the materials that are used in a small-wavelength regime (like for instance EUV), deteriorates rapidly with larger wavelengths. At wavelengths between 400-1500 nm, the coefficients of reflectivity of the reflective surface and the absorbing layer used in small-wavelength lithography are about the same. Consequently, pre-alignment of a reflective patterning structure with respect to the support structure may be difficult to obtain on the basis of a difference of reflectivity between absorbing layer and reflective substrate using light at larger wavelengths.

SUMMARY

One embodiment of the invention provides an apparatus including a first support structure configured to support an element including an alignment marker provided with at least one height difference. The apparatus further includes an alignment sensor comprising a light source configured to provide a light beam that illuminates the alignment marker, and at least one detector arranged to receive a reflection of the light beam from the alignment marker and configured to detect a location of the at least one height difference of the alignment marker based on the reflection. Embodiments of the invention also include use of such an apparatus to align the element with respect to the first support structure based on the at least one height difference.

In an embodiment of the invention, there is provided an apparatus including a first support structure configured to support an element, the element including an alignment marker provided with at least one height difference. The apparatus also includes an alignment sensor including a light source, the light source being configured to provide a light beam that illuminates the alignment marker; and at least one detector configured to detect the location of the at least one height difference of the alignment marker by analyzing the light beam reflected by the alignment marker in order to allow alignment of the element with respect to the first support structure.

In a further embodiment of the invention, the alignment sensor further includes imaging optics configured to control a trajectory and/or a characteristic of reflected light of the light beam impinging on the alignment marker towards the at least one detector.

In a further embodiment of the present invention, the apparatus is a lithographic apparatus, the element is a patterning structure and the first support structure is a support structure configured to support the patterning structure. Such a lithographic apparatus may further include a second support structure configured to support a substrate, an illumination system configured to provide a beam of radiation, the patterning structure serving to receive the beam of radiation and to produce a patterned beam with a pattern in its cross-section, and a projection system configured to project the patterned beam onto a target portion of the substrate.

An apparatus according to a further embodiment of the invention is configured to align an element (e.g. a patterning structure) with respect to a support structure on which the element is disposed. Such an apparatus may comprise a light source configured to direct a light beam onto at least one alignment marker arranged on said patterning structure, said light beam having an angle of incidence and a principal angle of reflectance; and a detector configured to receive a reflection of a portion of the light beam by said at least one alignment marker at an angle other than the principal angle of reflectance.

Embodiments of the invention also include device manufacturing methods, semiconductor devices manufactured with apparatus and/or methods as disclosed herein, patterning structures and methods of aligning an element as disclosed herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiments of the invention include an alignment sensor, a lithographic apparatus, and a device manufacturing method using the same. Embodiments of the invention also include a high-contrast marker provided on an element, wherein the contrast may result from the detection of at least one height difference present in the high-contrast marker.

FIG. 1 schematically depicts a lithographic apparatus according to an embodiment of the invention. The apparatus includes: an illumination system (illuminator) IL configured to provide a beam PB of radiation (e.g. UV or EUV radiation) and a first support structure (e.g. a mask table) MT configured to support a patterning structure (e.g. a mask) MA and connected to first positioning device PM configured to accurately position the patterning structure with respect to the projection system, ("lens") item PL. The apparatus further includes a substrate table (e.g. a wafer table) WT configured to hold a substrate (e.g. a resist-coated wafer) W and connected to a second positioning device PW configured to accurately position the substrate with respect to the projection system ("lens"), item PL, the projection system (e.g. a reflective projection lens) PL being configured to image a pattern imparted to the projection beam PB by a patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjusting structure configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the beam of radiation PB, having a desired uniformity and intensity distribution in its cross-section.

The beam PB is incident on the mask MA, which is held on the mask table MT. Being reflected by the mask MA, the beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

For pre-alignment purposes, the lithographic apparatus of the present invention is furthermore provided with at least one pre-alignment sensor. The sensor is used to pre-align components within a few microns to set up the consecutive alignment procedures.

Figure 1A:
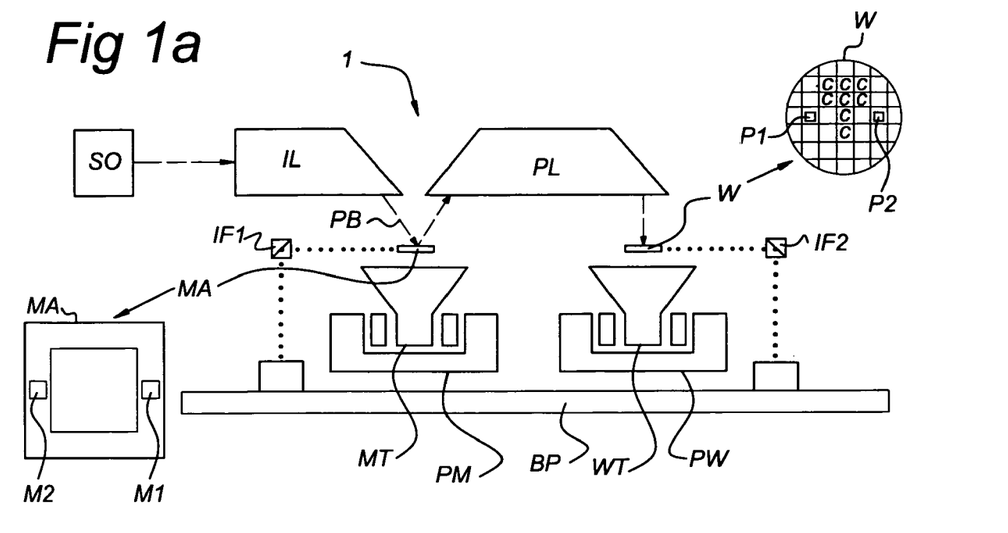
FIG. 1 depicts a lithographic apparatus according to an embodiment of the invention.
Figure 1B:
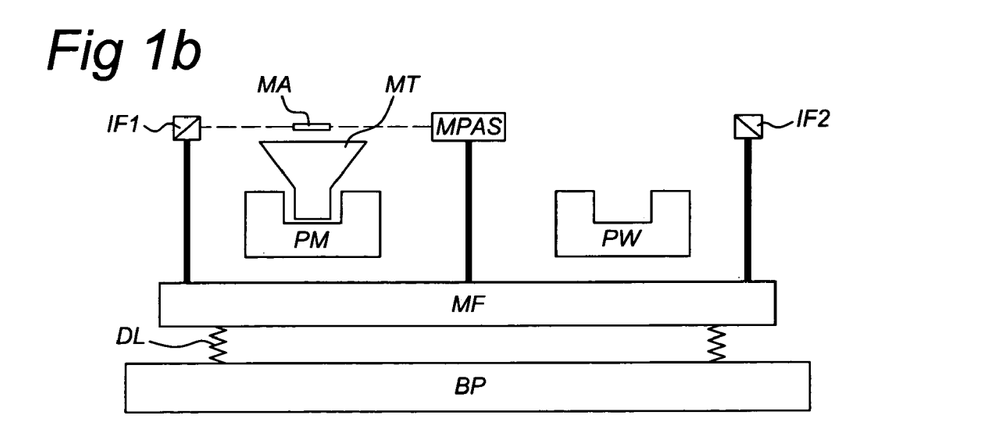

FIG. 1b shows an embodiment of a part of the lithographic apparatus shown in FIG. 1a. In this embodiment, the apparatus comprises a base frame BP, i.e. the frame of the lithographic apparatus on which all parts are mounted that are connected to the real world, and a so-called metro-frame MF, which is dynamically uncoupled to the base frame BP. The metro-frame MF is suspended within the lithographic apparatus, e.g. by using at least one dynamic link DL as shown in FIG. 1b and/or by employing another stabilizing system like an air mount system, to keep its position relative to the base frame BP fixed and minimize disturbances like vibrations. The metro-frame comprises critical assemblies including sensors like position sensors IF1 and IF2. In the present invention, a pre-alignment sensor MPAS is preferably mounted on the metro-frame, as shown in FIG. 1b.

With respect to a mask MA, pre-alignment is defined as measurements to be done to realize final position accuracy of the mask MA with respect the mask table MT. In present-day transmissive lithographic apparatus pre-alignment generally takes place before placement on the mask table, for example while the mask MA is held at a predetermined position, for example, by a robot arm. Preferably, several measurements are performed at different positions. There are several possible pre-alignment procedures.

In a well-known pre-alignment method, a first measurement on the mask MA at a first position with a first alignment sensor determines a position of the mask MA in three dimensions, e.g. X, Y and Rz. If position errors are present they are corrected for. After the first measurement, the mask MA is measured at a second position by a second pre-alignment sensor. Based on this second measurement, the mask table makes a correction movement. Consecutively, the mask MA is clamped, and the mask table MT moves together with the mask MA to measure a final position of the combination mask MA and mask table MT with an interferometer. From this measured position of the combination, a mask handling system calculates the position of the mask MA.

In another pre-alignment method, especially suitable for a reflective lithographic apparatus, e.g. a system employing EUV-radiation, the use of a single alignment sensor is preferred. In this method, the pre-alignment sensor MPAS is preferably mounted close to the mask table MA at a position that is suitable to monitor a mask load. Before the mask MA is placed at the mask table MT, the pre-alignment sensor MPAS measures a misalignment. After correction of this misalignment, the mask MA is clamped. Consecutively, the same pre-alignment sensor MPAS measures a final position of the mask MA with respect to the mask table MT. A final position of the combination can then be determined as before, i.e. by using an interferometer.

It will be appreciated that a sensor as disclosed herein can also be used in a pre-alignment procedure that differs from the aforementioned one. Furthermore, although the description herein primarily considers use in pre-alignment procedures, it will be appreciated that the use of such a sensor in consecutive alignment procedures may also be very useful and is expressly contemplated.

Alignment measurements regarding the relative position between mask MA and mask table MT can be performed indirectly or directly.

In an indirect measurement method, measurements using alignment sensors on marks on a mask MA are compared with measurements regarding the position of the mask table MT, which position is generally obtained by the use of interferometers. By connecting both alignment sensors and interferometers to the same object, i.e. a metro frame MF, at fixed positions relative to each other, the position of the mask MA with respect to the mask table MT can be determined.

In a direct measurement method, on the other hand, both mask MA and mask table MT are provided with markers. One or more alignment sensors detect the position of these markers simultaneously.

Figure 9A:
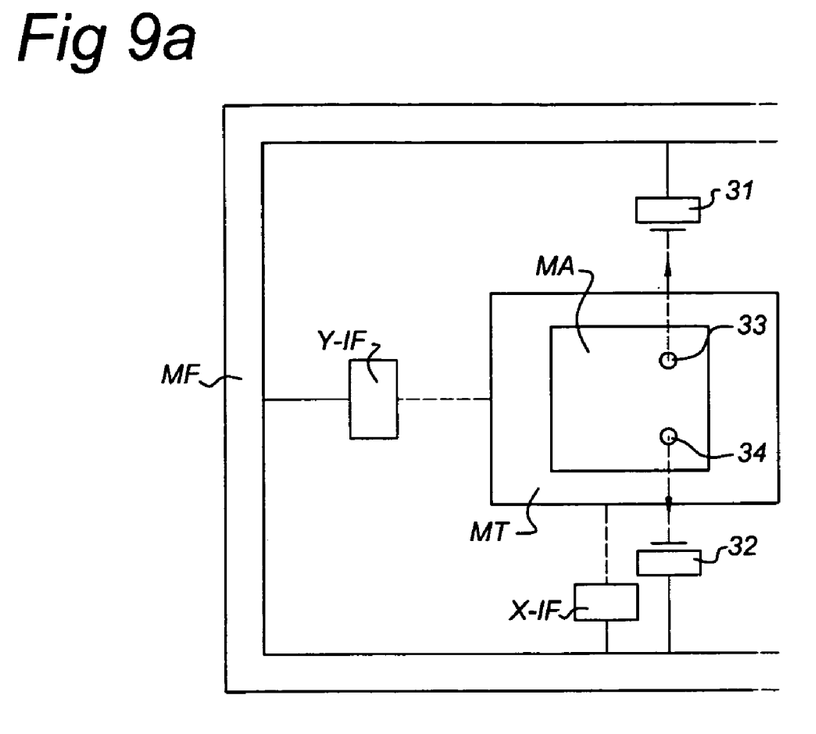
FIGS. 9a, 9b schematically show a top and a side view respectively of a measurement setup arranged for an indirect measurement.
Figure 9B:
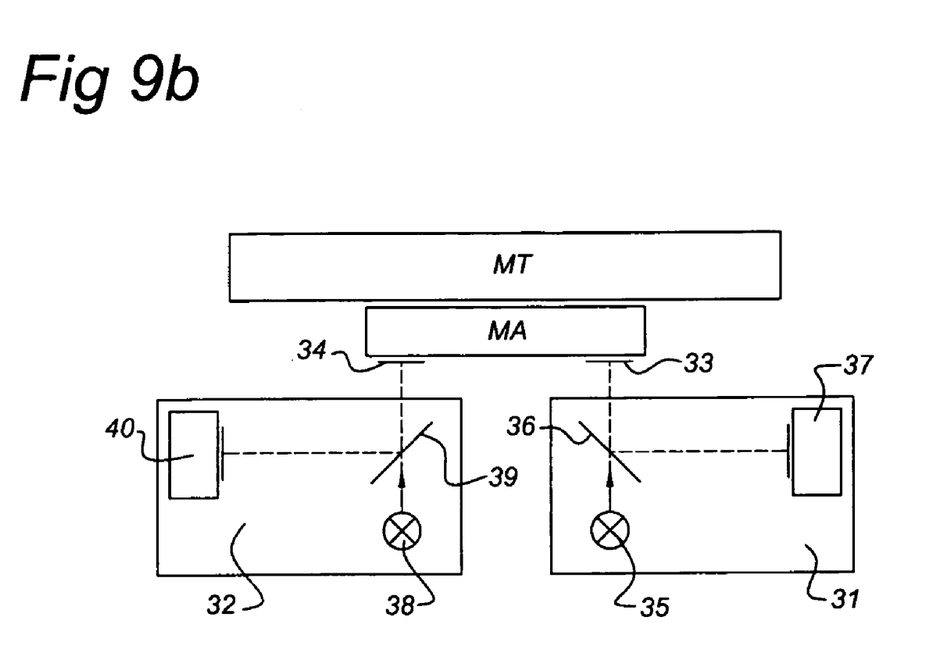

FIGS. 9a, b schematically show a top and a side view respectively of a measurement setup arranged for an indirect measurement. In FIG. 9a the metro frame MF is shown on which a number of sensors is mounted, i.e. interferometers X-IF and Y-IF as well as alignment sensors 31, 32. The sensors are arranged to measure the position of a mask table MT and a mask MA, in which the mask comprises alignment markers 33, 34. As can be seen in FIG. 9b, alignment sensors 31, 32 comprise illumination units 35, 38, optical elements like mirrors 36, 39, and detectors 37, 40 respectively. In this measurement setup, the position of the mask MA is measured by detecting the position of the markers 33, 34 on the mask MA with respect to the metro-frame MF. Similarly, the position of the mask table is measured with respect to the metro-frame MF, e.g. by using the interferometers X-IF and Y-IF. From both measurements the relative position between mask MA and mask table MT can be deduced. The number of components within an indirect measurement setup is generally lower than in a direct measurement setup as will be shown in FIGS. 10 and 11. Therefore, this setup is especially suitable for use in a vacuum environment, e.g. in a lithographic apparatus employing EUV-radiation.

Figure 10A:
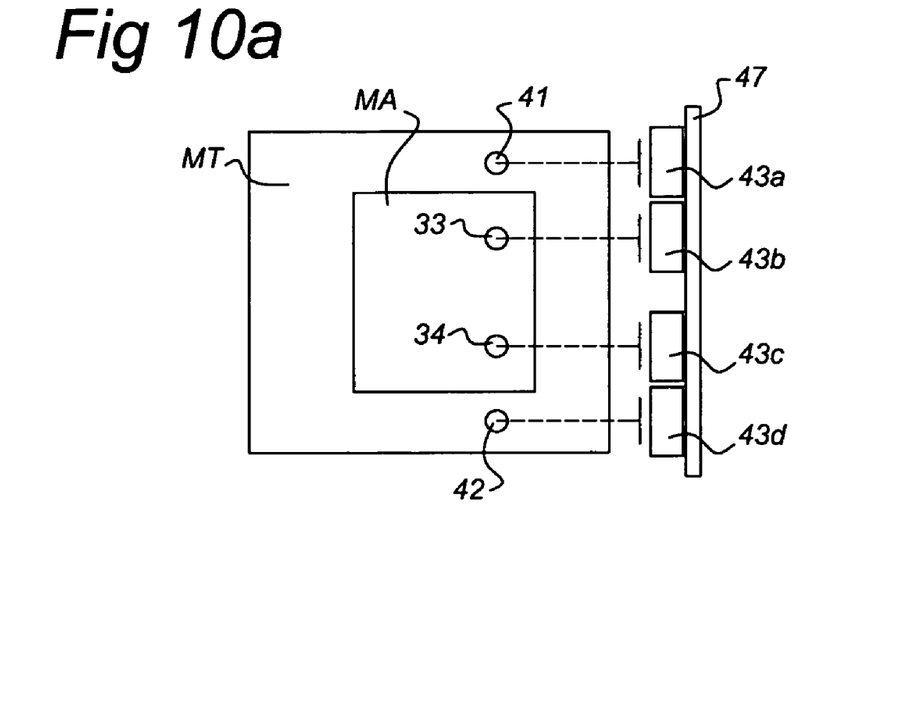
FIGS. 10a, 10b schematically show a top and a side view respectively of a first measurement setup arranged for a direct measurement.
Figure 10B:
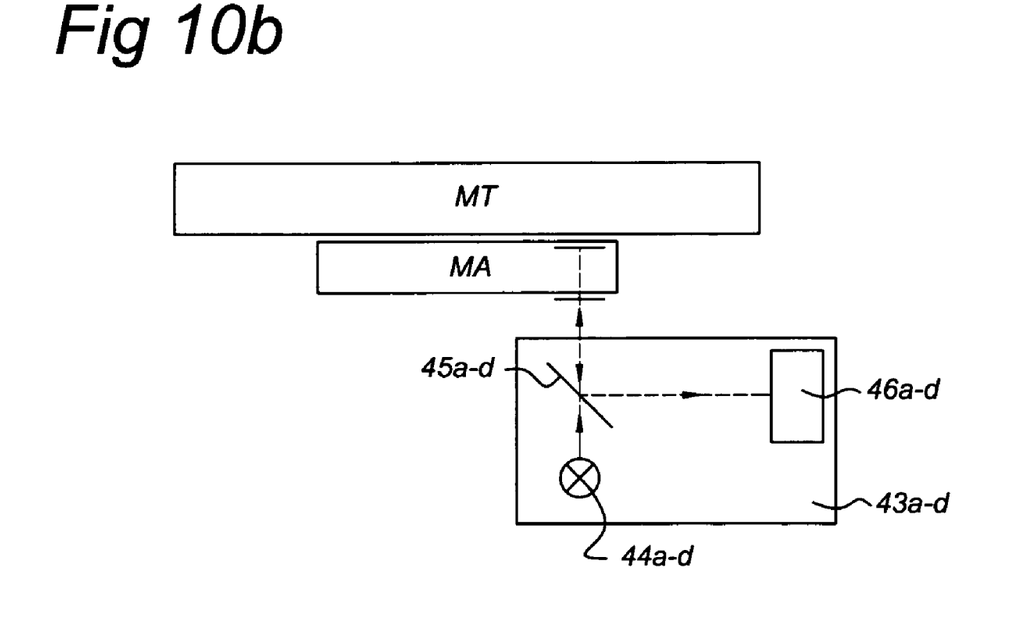

FIGS. 10a, b schematically show a top and a side view respectively of a measurement setup arranged for a direct measurement respectively. In a direct measurement, the requirements on the alignment sensors regarding position variations in time are less strict as long as the sensors are all subject to the same variations. In this setup, four alignment sensors 43a-d are mounted on a sensor plate 47, for instance a part of the metro frame MF. Each alignment sensor 43a-d again comprises an illumination unit 44, an optical element like a mirror 45 and a detector 46. Alignment sensors 43a and 4d are arranged to measure the position of markers 41 and 42 respectively on mask table MT, while alignment sensors 43b and 43c measure the position of markers 33, 34 on the mask MA respectively. Since the position of all markers 33, 34, 41 and 42 is measured simultaneously, position variations of sensors 43a-d has no effect on the accuracy of the measurement of the position of the mask MA with respect to the mask table MT.

Figure 11A:
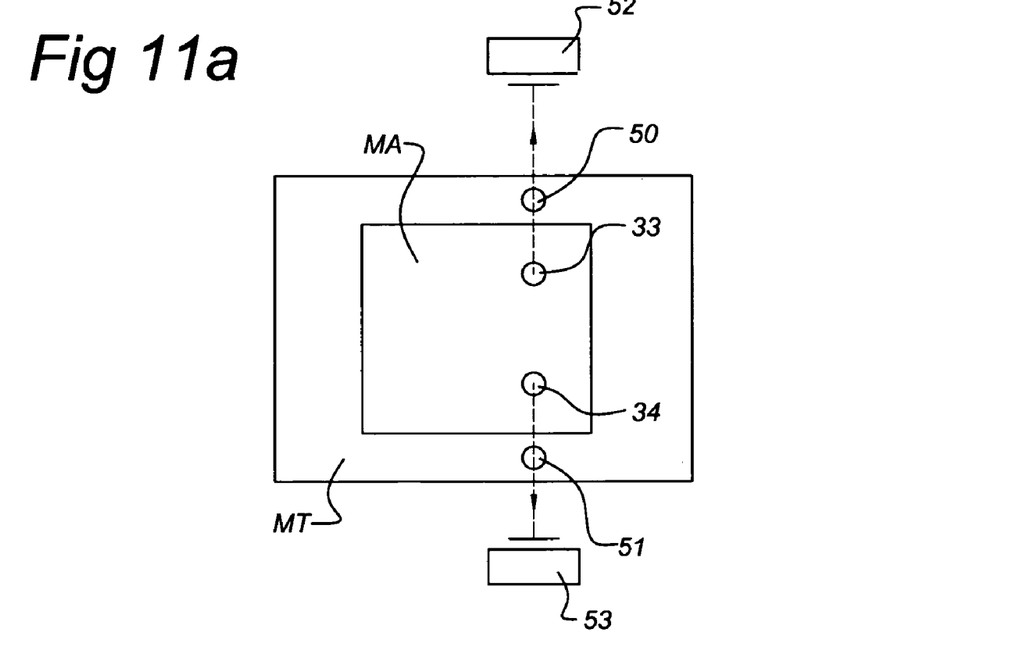
FIGS. 11a, 11b schematically show a top and a side view respectively of a second measurement setup arranged for a direct measurement.
Figure 11B:
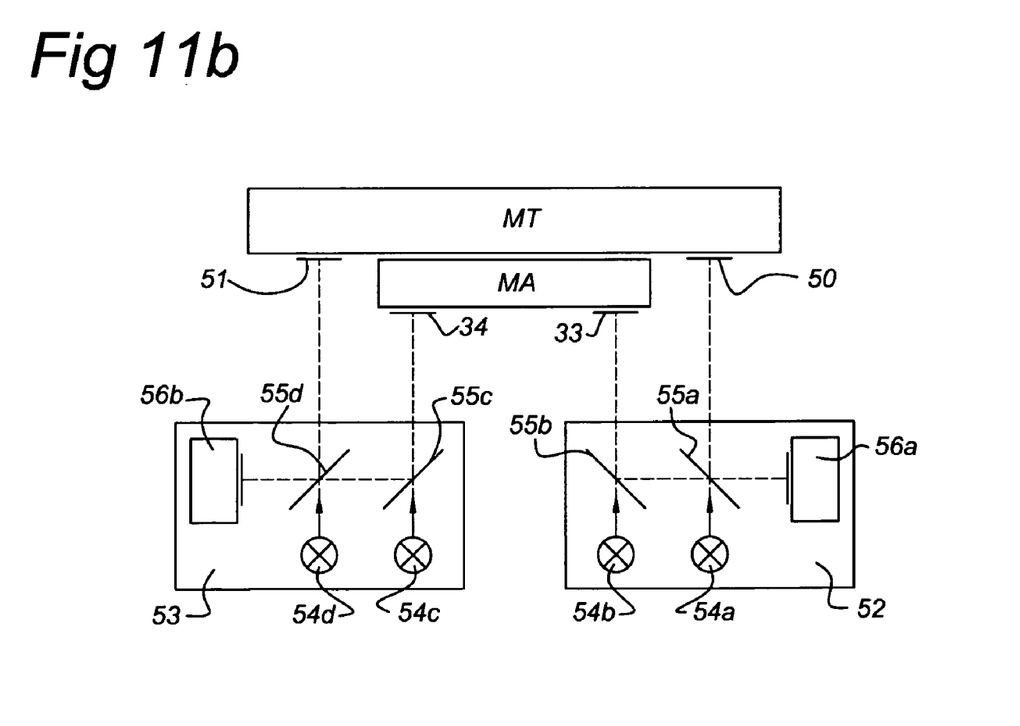

In the measurement setup shown in FIG. 10, four alignment sensors 43a-d are needed to determine the position of four markers 33, 34, 41 and 42. FIGS. 11a, b schematically show a top and a side view respectively of a measurement setup arranged for a direct measurement with less components than used in the measurement setup of FIG. 10. In this setup, the number of sensors is reduced to two. Sensor 52 comprises two illumination units 54a, 54b, two optical elements like mirrors 55a, 55b and a single detector 56a. Sensor 53 comprises two illumination units 54c, 54d, two optical elements like mirrors 55c, 55d and a single detector 56b. The reduction of the number of components by eliminating two detectors is established by projecting the image of a marker on the mask MA, i.e. one of mask markers 33, 34, and the image of a marker on the mask table MT, i.e. one of markers 50, 51, on a single detector as is schematically shown in FIG. 11b. To accomplish this, markers 33, 34 on the mask MA need to be distinguishable from the markers 50, 51 on the mask table MT. In the shown measurement setup, detector 56a receives an image of mask marker 33 and mask table marker 50, while detector 56b receives an image of both mask marker 34 and mask table marker 51. Again the position of markers 33, 34 on the mask MA and the position of the markers 50, 51 on the mask table MT are measured simultaneously. Therefore a position variation of an alignment sensor 52, 53 has no effect on the accuracy of the measured relative position between mask MA and mask table MT.

Figure 2:
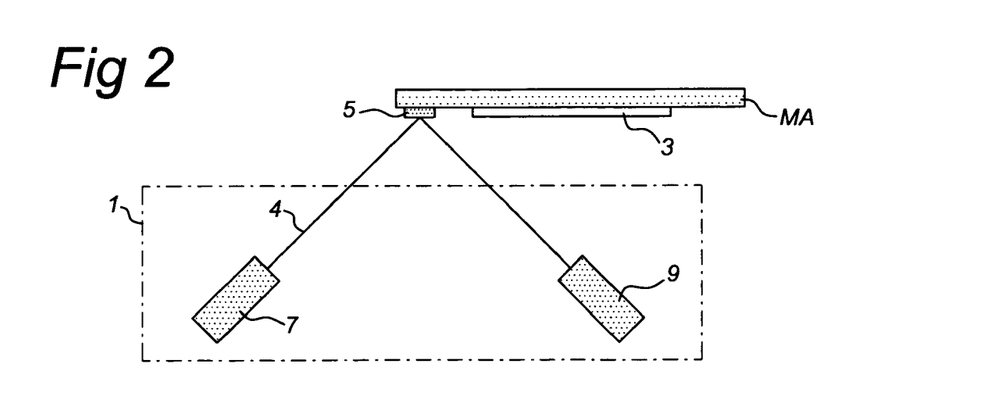
FIG. 2 depicts a conventional alignment sensor.

FIG. 2 shows a pre-alignment sensor 1 configured for the pre-alignment of a reflective mask MA. A light source 7 projects a light beam 4 on a pre-alignment marker 5 located on a mask MA next to the lithographic pattern 3 to be exposed. In addition, besides the aforementioned pre-alignment marker 5 an additional pre-alignment marker may be positioned on the mask table MT for pre-alignment purposes. The pre-alignment marker 5 may be one of the alignment markers M1 and M2, used in the alignment procedure, but may also be an additional marker for pre-alignment purposes. The pre-alignment marker 5 will therefore in the rest of this document be referred to as alignment marker 5, and the pre-alignment sensor 1 will be referred to as alignment sensor 1.

Alignment marker 5 includes absorbing and reflecting parts that form a useful pattern. Part of the projected beam 4 is reflected and detected by at least one detector 9. An analysis of the detected image reveals what compensation should be applied to position mask MA correctly. The concept of reflection herein refers to all kind of light that is bounced off the surface as a result of the impingement of light beam 4. This includes light that is reflected by diffraction, scattering or diffuse reflection.

A sensor source 7 generally generates radiation with a wavelength between about 400-1500 nm. However, each component within the lithographic apparatus of the present invention, including the mask, is optimized for a much smaller wavelength, e.g. corresponding with EUV, that is generated by source SO. Therefore, it may not be practical to use such a sensor source 7 with alignment marker 5 if the latter is made in the same production steps as are used to produce pattern 3.

Figure 3A:
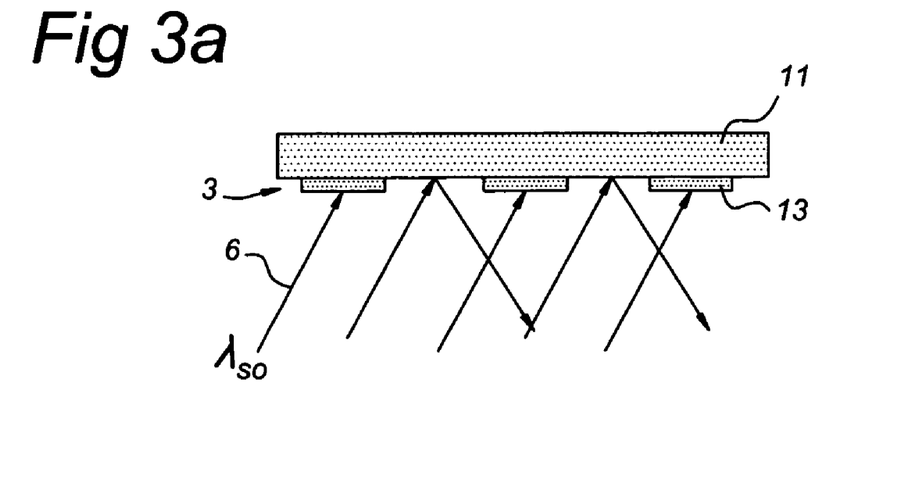
FIGS. 3a and 3b show a reflective patterning structure illuminated with different wavelength beams.

As shown in FIG. 3a, a reflective mask MA includes a mask substrate 11 with a reflective surface covered with pattern 3 that is designed to be transferred to a target portion of a substrate. For the sake of simplicity the reflective surface, which is generally constructed using a multi-layer coating, is drawn as a part of the mask substrate 11. The pattern 3 may be created by selectively depositing a radiation-absorbing layer 13 on top of the reflective surface, that absorbs the incoming projection beam of radiation 6 to a great extent. On a mask substrate 11, a pattern may be made by selectively depositing a radiation-absorbing layer 13 on top of said mask substrate 11. The thickness of the radiation-absorbing layer 13 generally is about 50-500 nm. The material that is used is known to someone skilled in the art, and may be selected from a group including Cr, TaN, TaSiN, TiN and SiMo. For the sake of simplicity no additional buffer layers are drawn, although they may be present. The buffer layers, which are generally used to enable mask patterning and repair, may comprise materials like $SiO_2$, Si, SiON, C and Ru.

An incoming beam of radiation 6 is partly reflected by the reflective surface of the mask substrate 11, and partly absorbed by the absorbing layer 13. The detector 9 detects a difference in reflectivity and the information is then translated in a difference in intensity as a function of position. By comparing the detected values with reference values, the difference between the actual and the desired position of the mask MA may be established.

Figure 3B:
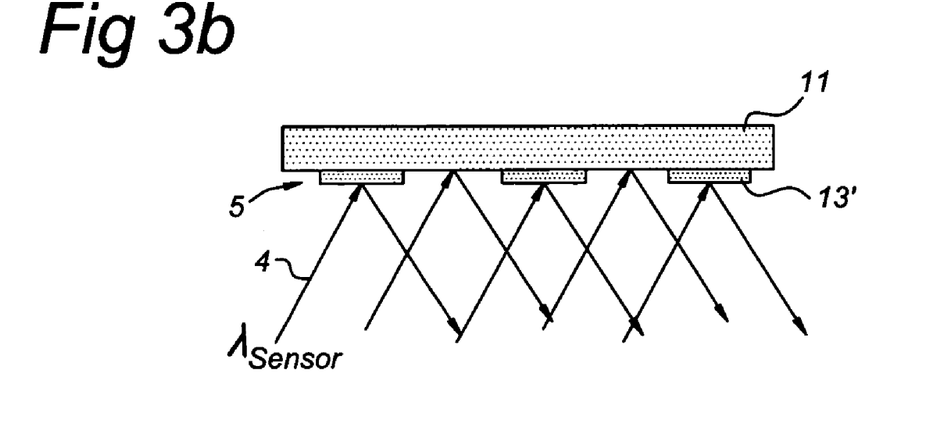

Alignment marker 5 that is located on mask MA may be constructed in the same fashion as a pattern on a mask MA. Unfortunately, the absorption of radiation-absorbing layer 13 is wavelength-dependent and as described before, the wavelength $\lambda_{sensor}$ of the incoming beam of radiation 4 projected on the alignment marker 5 by the sensor source 7 can be longer than the wavelength $\lambda_{SO}$ of the beam of radiation 6. The consequences of the use of the different wavelength is depicted in FIG. 3b. The radiation-absorbing layer 13' no longer absorbs an incoming beam of radiation 4. Both the light beamlets projected on the absorbing layer 13' as well as the light beamlets projected on the reflective mask substrate 11 are reflected in a substantially equal fashion. As a result the detector 9 can no longer detect a significant difference in intensity and therefore accurate pre-alignment of the mask MA may become difficult.

In order to enable the detector 9 to detect the difference in reflectivity at longer wavelengths, different materials for the absorbing layer 13' at the location of the marker may be used. The different absorbing layer is arranged to absorb the light emitted by the sensor source 7. Consequently, the detector 9 can again detect a difference in intensity between the two surfaces, and the position of the marker can be established accurately. However, in this approach, in order to create the aforementioned configuration, it is desirable to manufacture the mask pattern 3 and the alignment marker 5 using different process flows. As a result, misalignment between alignment marker 5 and mask pattern 3 may exist, since an alignment step is needed to manufacture one with respect to the other. In addition, the processing of the alignment marker 5 could also deteriorate the quality of the mask pattern 3 and vice versa. Therefore, it may be desirable to use a technique other than different radiation-absorbing layers at separate locations on top of the mask substrate 11.

Figure 4:
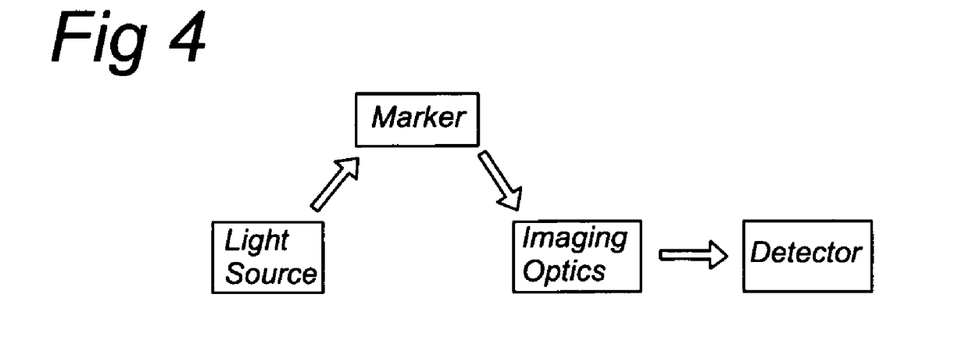
FIG. 4 schematically shows a method for aligning a patterning structure according to an embodiment of the present invention.

FIG. 4 schematically shows a method to align the patterning structure according to an embodiment of the present invention. Although the reflection difference between the radiation-absorbing layer 13' and the reflective surface may be very small, there is a height difference corresponding to the thickness of the radiation-absorbing layer 13' and optionally to the thickness of one or more intermediate buffer layers. The alignment sensor 1 according to an embodiment of the present invention is therefore arranged to determine the position of an alignment marker 5 by detecting height differences instead of differences in reflectivity. Besides a light source 7 and a detector 9, the alignment sensor 1 according to an embodiment of the invention also includes imaging optics 8. The imaging optics 8 are arranged to enable the detector 9 to detect differences in intensity by processing and thereby enhancing an alignment marker image caused by height differences of and/or within the alignment marker 5. The detector 9 may be any known detector in the art, like a (CCD)-camera, a position-sensitive detector (PSD) or a quad cell.

Because the alignment sensor of the present invention 1 may use a conventional sensor source 7 that generates a light beam with a wavelength in the range of 400-1500 nm, the alignment sensor 1 may be constructed to be not expensive. Note that the alignment marker 5 and the mask pattern 3 are illuminated by different sources, each source generating radiation with a different wavelength. As a result the alignment sensor 1 may be used independently from the illuminator IL of the lithographic apparatus. In an embodiment of the invention, the alignment sensor 1 can be provided within the lithographic apparatus, thus enabling the alignment to be performed in situ.

Height differences lead to several effects that can be used by the imaging optics. In an embodiment of the invention, the imaging optics may include elements that enable the use of both bright-field and dark-field illumination. When dark-field illumination is used, the fact that height differences lead to sharp edges at the side of patterns is used. Illumination of such a pattern at an oblique angle, leads to scattering of the light at the sharp edges. Consequently, when the imaging optics 8 and the detector 9 are adapted in a suitable fashion, the detector may observe the edges as bright lines in a dark background.

The alignment marker 5 may include a single edge, a grating, a grid or any combination of these elements to create any marker shape or pattern that is required. A dense pattern of radiation-absorbing layer lines (a grating) allows the creation of an alignment marker 5 with a large bright area, for example, with a circular shape, utilizing the diffraction at the grating pattern. It will be appreciated that one or more of the diffracted orders may then be used for imaging. Such a grating may include numerous lines with a width of about 1-1000 nm and a height of about 50-500 nm at a periodic distance of several tens of microns.

The use of bright-field illumination exploits the fact that the difference in height between the top of the reflective surface and the top of the radiation-absorbing layer introduces a phase-difference between light beamlets impinging on one or the other, resulting in phase-contrast in the image. The imaging optics can be adapted to enable the application of some sort of shearing technique to enhance the phase-contrast, thereby generating a high contrast marker image. Again, a single edge phase step, phase grating or grid can be given any desired shape or pattern in order to create any marker shape or pattern that is required.

Figure 5:
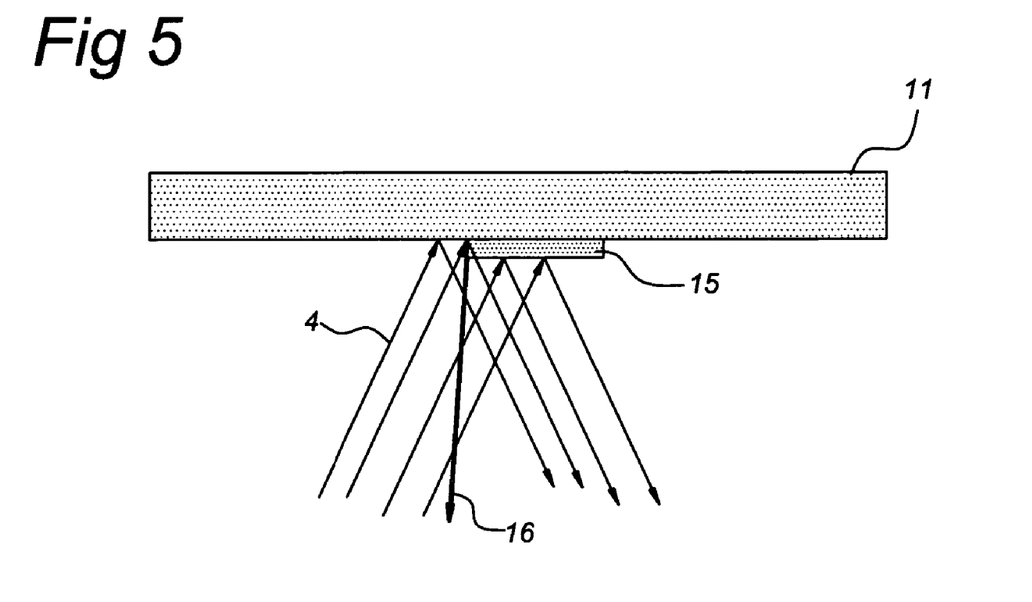
FIG. 5 shows the concept of scattering and diffraction.

FIG. 5 schematically shows the concept of scattering/diffraction of light beamlets. A mask is provided with a single structure 15. Although a single structure 15 is represented in FIG. 5, it should be understood that the concept may be further enhanced by using more structures. The structure 15 is made of the radiation-absorbing material that is also used for the creation of the pattern 3 on the mask MA. Since the sensor source 7 generates a light beam 4 of a wavelength that is not well-absorbed by the radiation-absorbing material, the beamlets falling on the reflective surface of mask substrate 11 of the mask MA reflect equally well as the beamlets falling on the structure 15 including the radiation-absorbing material. However, the beamlet that hits the side of the structure 15 is reflected in an entirely different direction; it scatters, as indicated with a fat arrow 16. By providing a number of structures in a periodic pattern, the beamlets, which scatter on the structures, form a diffraction pattern.

Figure 6:
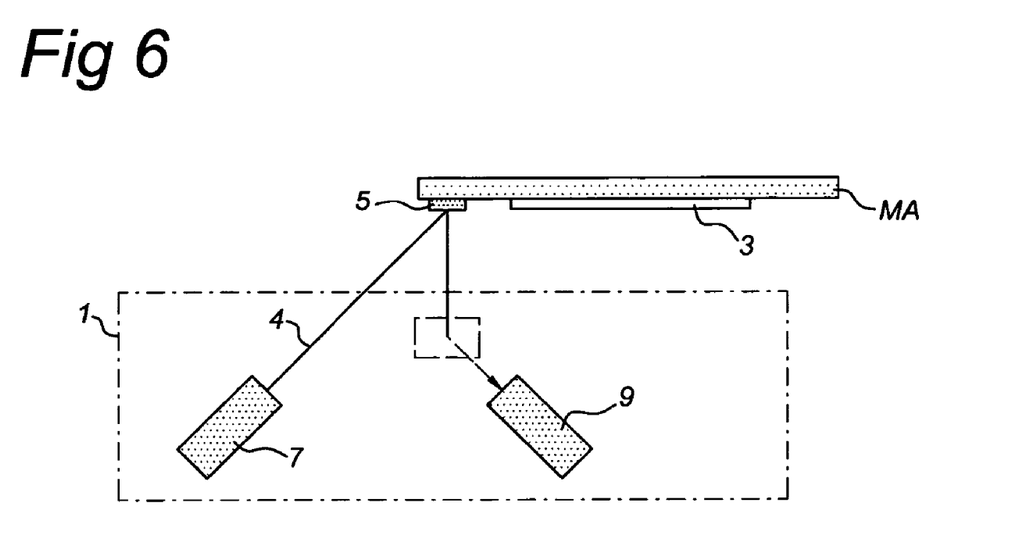
FIG. 6 shows an apparatus configured to align a patterning structure according to an embodiment of the present invention.

By composing an alignment marker 5 with suitable structures and by using the imaging optics 8, the direction (change of direction of arrow) and intensity (solid line becomes dashed line) of scattered or diffracted beamlets can be controlled as depicted in FIG. 6. The detector 9 of the alignment sensor 1 can therefore be positioned at any suitable position in the lithographic apparatus. Since the structure of the alignment marker 5 and its position on the mask MA is known, the position of the mask MA can be determined.

In an embodiment of the invention, the roughness of a surface can be used for the same purpose, as long as height differences associated with said roughness are large enough. The impinging light beam will in this case reflect in a diffused manner. The alignment marker may then for example be formed by providing a pattern including a combination of at least one surface area with a certain roughness surrounded by a surface area with a different (e.g. smaller) roughness. Note that a marker using a radiation-absorbing layer may fit the aforementioned characteristics. In such an embodiment of the invention, a rough surface can be simulated by providing a number of height differences closely together. The radiation-absorbing layer then again introduces the height differences.

Figure 7A:
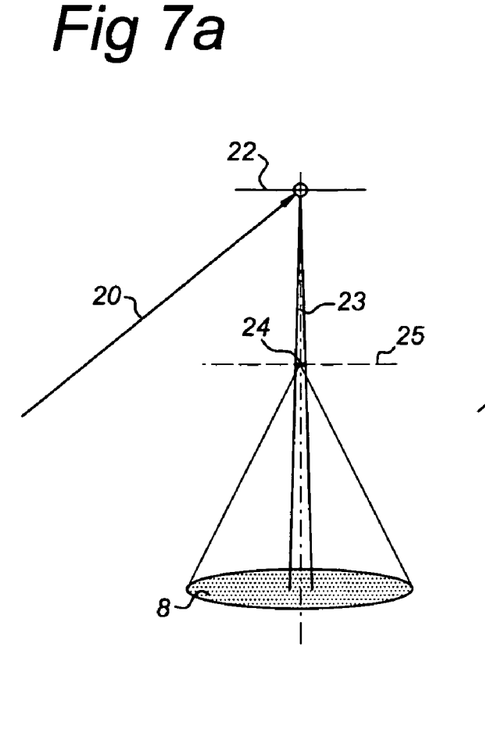
FIGS. 7a, 7b schematically illustrate the influence of tilt for a marker in a defocus position.
Figure 7B:
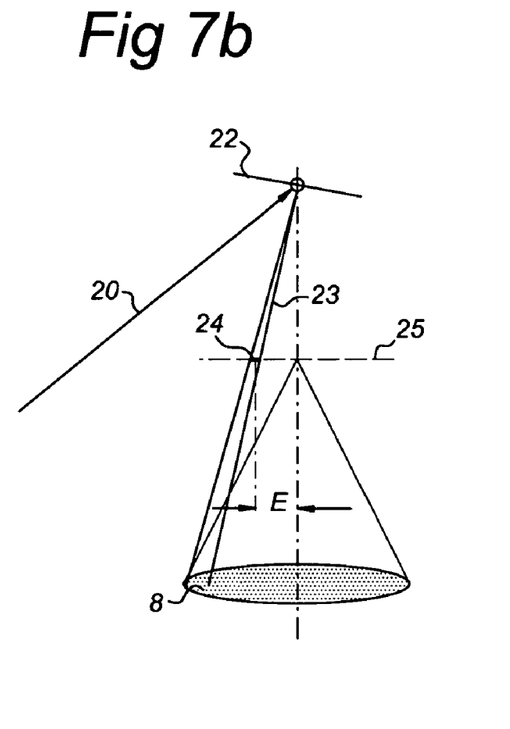
Figure 8:
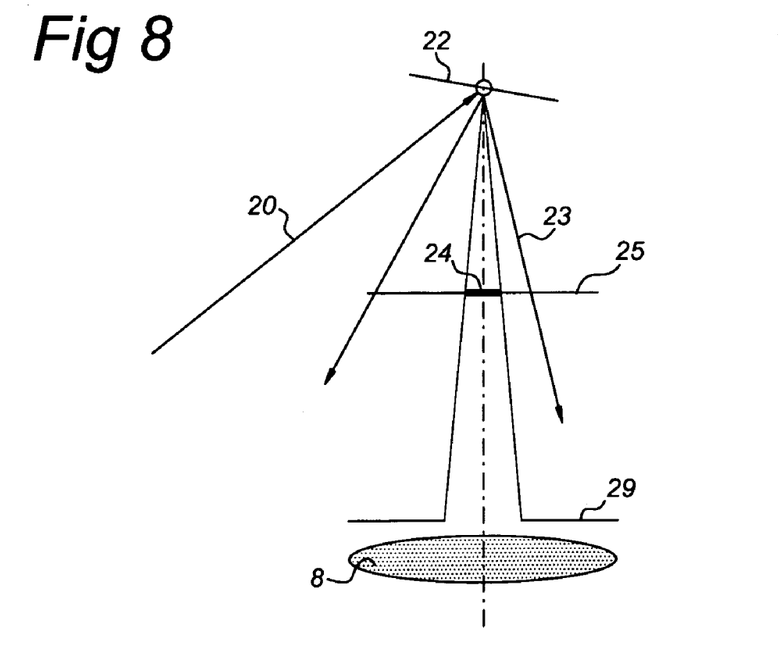
FIG. 8 schematically depicts an apparatus configured to align a patterning structure according to an embodiment of the present invention.

FIGS. 7a, 7b, and 8 illustrate embodiments of the invention, in which a reflective alignment marker 22 is incorporated for use with a diffractive grating. The alignment marker 22 can be imaged using an alignment sensor 1 as described herein. The alignment marker 22 may be positioned at different distances from the alignment sensor imaging optics 8 and thus may be out of focus. When the alignment marker 22 is at a defocus position, the alignment sensor 1 becomes more sensitive to tilt. The tilt of the beam coming from the alignment marker 22 may be caused by several effects like tilt of the alignment marker 22, a wavelength shift of the light source 7, an incorrect grating period of a diffractive grating, a position error of the light source 7, etc.

In a case where the divergence of the diffracted beam 23 is smaller than the numerical aperture of the imaging optics 8, or if the beam 23 does not fill the pupil of the imaging optics 8 in an entirely homogeneous manner, the sensitivity to tilt may increase dramatically. As a result, a slight tilt of the alignment marker 22 may result in a measurement error, especially when the image 24 of the alignment marker 22 is out of focus. The aforementioned situation is depicted in FIGS. 7a and 7b, wherein the imaging optics 8 for simplicity is represented by a single optical element (e.g. lens). Without tilt, the image 24 of the alignment marker 22 is still positioned correctly via diffracted beam 23 at a focal plane 25 of the imaging optics 8, even though the image 24 of the alignment marker 22 is out of focus, as shown in FIG. 7a. However, a slight tilt of the diffracted beam 23 may induce a large error E, as shown in FIG. 7b. The position of the image 24 of the alignment marker 22 that will be imaged is shifted.

In an embodiment of the present invention, shown in FIG. 8, the numerical aperture (NA) of the imaging optics 8 is overfilled. When the divergence of the beam 23 from the alignment marker 22 is larger than the aforementioned NA, such that the intensity distribution in the pupil of the imaging optics 8 is uniform, the tilt-related problem becomes negligible. The aforementioned situation can be realized in several ways. First the NA of the imaging optics 8 can be decreased, by introducing, for example, a limiting entrance pupil 29. Secondly the divergence of the diffracted beam 23 can be increased, e.g., by tuning the width of the grating or grid features, by varying the grating or grid period along one or more features along the alignment marker 22, by increasing the number and/or size of the light source 7, by using a light source 7 with a large bandwidth or by selecting the angle of incidence of the light beams 20 that illuminate the alignment marker 22 and the grating period in such a way that the diffracted beams 23 from individual light sources 7 have a somewhat different angle and/or by several other methods. The use of one or more of aforementioned options may provide the present invention with a diffractive beam 23 with an adequate width and intensity distribution.

The imaging optics can enhance the contrast of the marker image. Furthermore it may be configured to enable a flexible placement of the at least one detector within a lithographic apparatus.

Applications of embodiments of the invention may include use of the at least one height difference to detect the alignment marker with the at least one detector to enable the determination of the position of the alignment marker when light with a wavelength between about 400-1500 nm is used to impinge on the alignment marker.

By using an alignment marker with a height difference, the patterning structure can be provided with an alignment marker and a pattern, which serves to impart the projection beam with a pattern in its cross-section. In an embodiment of the invention, both structures can be manufactured simultaneously in the same manufacturing process. Sequential manufacturing of both structures in different processes may create a high risk of misalignment between the two objects. Furthermore the processing of the alignment marker may then deteriorate the quality of the pattern and vice versa.

In a further embodiment of the invention, the patterning structure is a reflective patterning structure and the alignment marker is a reflective marker. Such an arrangement may be used to enable the patterning of a beam of radiation with a small wavelength, i.e. smaller than about 200 nm, e.g., EUV-radiation.

The reflective marker may include a reflecting surface, upon which in at least one area, a radiation-absorbing layer is deposited, the radiation-absorbing layer introducing at least one height difference and being arranged to absorb radiation with a wavelength corresponding to a wavelength of the projection beam of radiation provided by the illumination system. When the pattern that is used to impart the projection beam of radiation with its cross-section is manufactured in the same way, both features can be manufactured in the same manufacturing process. The radiation-absorbing layer may have thickness of about 50-500 nm, and may include a material selected from the group consisting of Cr, TaN, TaSiN, TiN and SiMo.

In a further embodiment the imaging optics and the at least one detector are arranged to enable alignment using at least one of diffraction, scattering, diffuse reflection and phase-contrast. These optical phenomena may be used to enhance the contrast of the image of the alignment marker.

In embodiments of the invention as disclosed herein, the alignment marker may include any combination of at least one of one or more elements selected from the group consisting of a single edge marker, a grating, and a grid.

In embodiments of a lithographic apparatus as described herein, the alignment sensor may be independent of the illumination system of the lithographic apparatus. The light beam generated by the light source of the alignment sensor may have a different wavelength than the projection beam of radiation provided by the illumination system. It will be appreciated that embodiments of the invention include applications in which the light beam does not apply an additional dose to the target portion of the substrate (e.g. does not expose a resist layer). The beam of radiation may be EUV radiation, while the light beam may have a wavelength in a range of 400-1500 nm.

In embodiments of a lithographic apparatus as described herein, the alignment sensor may be provided within the lithographic apparatus to enable the alignment to be performed in situ. This measure may be used to enable the operation of the alignment sensor in a vacuum environment.

Embodiment of the invention include a semiconductor device manufactured with an apparatus as disclosed herein.

In another embodiment of the invention, there is provided a device manufacturing method including providing a substrate; providing a beam of radiation using an illumination system; using patterning structure supported by a support structure to impart the beam of radiation with a pattern in its cross-section; and projecting the patterned beam of radiation onto a target portion of the substrate, wherein prior to the using, the method includes, for the purpose of aligning the patterning structure with respect to the support structure: providing a light beam, impinging the light beam on an alignment marker with at least one height difference on the patterning means and detecting the at least one height difference of the marker with at least one detector.

In an embodiment of the invention, there is provided a device manufacturing method including patterning a beam of radiation with a patterning structure according to a desired pattern, the patterning structure being supported by a support structure; and projecting the patterned beam of radiation onto a target portion of a substrate, wherein prior to the patterning, the method includes aligning the patterning structure with respect to the support structure, the aligning including: impinging a light beam on an alignment marker disposed on the patterning structure, the alignment marker including at least one height difference, and detecting the at least one height difference of the marker with at least one detector.

In yet another embodiment of the invention, there is provided a semiconductor device produced with a device manufacturing method as disclosed herein.

In an embodiment of the invention, there is provided a patterning structure including a pattern that is used, upon illumination, to impart a beam of radiation with its cross-section; and an alignment marker; wherein the pattern and the alignment marker are manufactured in parallel using the same manufacturing process.

In a further embodiment of the invention, the pattern is illuminated by a projection beam of radiation and the marker is illuminated by a light beam. The wavelengths of the both beams are different. In a further embodiment of the invention, the beam of radiation is EUV radiation and the light beam has a wavelength in a range of about 400-1500 nm.

Yet another embodiment of the invention includes a method of aligning an element including an alignment marker provided with at least one height difference, the method including providing a light beam on the alignment marker and producing reflected light coming from the alignment marker, and detecting the at least one height difference of the alignment marker using the reflected light in order to allow the aligning of the element.

In an embodiment of the invention, there is provided a method of aligning an element including an alignment marker provided with at least one height difference, the method including: illuminating the alignment marker with a light beam; and detecting the at least one height difference of the alignment marker with the light beam reflected by the alignment marker.

In an embodiment of the invention, the element including the alignment marker can be aligned by using any type of light with a wavelength between 400-1500 nm.

In yet another embodiment of the invention, there is provided an apparatus for aligning a patterning structure with respect to a support structure on which the patterning structure is disposed, the apparatus including: a light source configured to illuminate at least one alignment marker arranged on the patterning structure; and a detector configured to receive light reflected by the at least one alignment marker and to detect height differences within the at least one alignment marker.

While specific embodiments of the invention have been described above, it will be appreciated that the invention may be practiced otherwise than as described. Embodiments of the invention also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

What is claimed is:

1. An apparatus comprising:
   a first support structure configured to support an element, said element including a reflective alignment marker provided with at least one height difference; and
   an alignment sensor comprising:
   a light source configured to provide a light beam that illuminates the reflective alignment marker, wherein the light beam includes an angle of incidence and a principle angle of reflectance;

imaging optics configured to selectively receive that fraction of the energy of the light beam reflected by at least one height difference of the reflective alignment marker; and at least one detector arranged to detect a location of the at least one height difference of the reflective alignment marker, based on the received fraction of the energy of the light beam, to enable an alignment of said element, and wherein a divergence of the light beam from the reflective alignment marker is larger than a numerical aperture of the imaging optics, such that an intensity distribution in a pupil of the imaging optics is uniform.

2. The apparatus according to claim 1, wherein said apparatus is configured to align said element with respect to said first support structure based on the detected location of the at least one height difference.

3. The apparatus according to claim 1, wherein the imaging optics are configured to control at least one of the group consisting of the geometry of propagation of said fraction of the energy of the light beam directed toward said detector and a characteristic of said fraction of the energy.

4. The apparatus according to claim 3, wherein the imaging optics and the at least one detector are configured to align said element by at least one of the group consisting of diffraction, scattering, diffuse reflection, and phase-contrast of the light beam by the reflective alignment marker at an angle other than the principal angle of reflectance.

5. The apparatus according to claim 3, wherein the imaging optics is configured to control a first part of the fraction of the energy of the light beam directed toward said detector and block a second part of the fraction of the energy of the light beam directed toward said detector.

6. The apparatus according to claim 1, wherein the element comprises a patterning structure configured to receive a beam of radiation and to produce a patterned beam having a pattern in its cross-section, said apparatus comprising:

an illumination system configured to provide the beam of radiation;

a second support structure configured to support a substrate; and a projection system configured to project the patterned beam onto a target portion of the substrate.

7. The apparatus according to claim 6, wherein the beam of radiation comprises EUV radiation, and the light beam has a wavelength in a range of about four hundred (400) to fifteen hundred (1500) nanometers.

8. The apparatus according to claim 6, wherein the alignment sensor is independent of the illumination system.

9. The apparatus according to claim 8, wherein the apparatus further comprises a metro frame, and the alignment sensor is connected to the metro frame.

10. The apparatus according to claim 6, wherein the patterning structure comprises a reflective patterning structure and the reflective alignment marker.

11. The apparatus according to claim 10, wherein the reflective marker comprises a reflecting surface upon which, in at least one area, a radiation-absorbing layer is deposited, the radiation-absorbing layer introducing at least one height difference and being arranged to absorb radiation with a wavelength corresponding to a wavelength of the beam of radiation provided by the illumination system.

12. The apparatus according to claim 11, wherein the radiation-absorbing layer has a thickness of about 50 (fifty) to 500 (five hundred) nanometers.

13. The apparatus according to claim 11, wherein the radiation-absorbing layer comprises a material selected from the group consisting of Cr, TaN, TaSiN, TiN and SiMo.

14. The apparatus according to claim 1, wherein the reflective alignment marker comprises at least one marker selected from the group consisting of a single edge marker, a grating, and a grid.

15. The apparatus according to claim 14, wherein the grating or the grid period of the reflective alignment marker is configured to be tuned such that the divergence of the light beam from the reflective alignment marker is increased.

16. The apparatus according to claim 1, wherein the alignment sensor is provided within the apparatus to enable in-situ alignment.

17. A semiconductor device manufactured using the apparatus of claim 1.

18. The apparatus according to claim 1, further comprising a limiting entrance pupil coupled to the imaging optics and arranged to make the divergence of the light beam from the reflective alignment marker larger than a numerical aperture of the imaging optics.

19. The apparatus according to claim 1, wherein the numeric aperture of the imaging optics is configured to be decreased.

20. An apparatus configured to align a patterning structure with respect to a support structure on which the patterning structure is disposed, the apparatus comprising:

a light source configured to direct a light beam onto at least one alignment marker arranged on said patterning structure, said light beam having an angle of incidence and a principal angle of reflectance;

imaging optics configured to selectively receive that fraction of the energy of the light beam reflected by at least one height difference of the alignment marker; and a detector configured to detect a location of a at least one height difference of the alignment marker, based on the received fraction of the energy of the light beam, at an angle other than the principal angle of reflectance, to enable an alignment of the patterning structure, and wherein a divergence of the light beam from the alignment marker is larger than a numerical aperture of the imaging optics, such that an intensity distribution in a pupil of the imaging optics is uniform.

21. The apparatus according to claim 20, wherein said at least one height difference includes an elevation formed by said at least one alignment marker on said patterning structure.

22. The apparatus according to claim 20, further comprising a limiting entrance pupil coupled to the imaging optics and arranged to make the divergence of the light beam from the reflective alignment marker larger than a numerical aperture of the imaging optics.

23. The apparatus according to claim 20, wherein the alignment marker comprises at least one marker selected from the group consisting of a single edge marker, a grating, and a grid.

24. The apparatus according to claim 23, wherein the grating or the grid period of the reflective alignment marker is configured to be tuned such that the divergence of the light beam from the reflective alignment marker is increased.

25. The apparatus according to claim 20, wherein the numeric aperture of the imaging optics is configured to be decreased.

* * * * *